(12) United States Patent
Winebrand et al.

(10) Patent No.: US 7,940,204 B1
(45) Date of Patent: May 10, 2011

(54) ABSORBER ASSEMBLY FOR AN ANECHOIC CHAMBER

(75) Inventors: Mark Winebrand, Montgomeryville, PA (US); John F. Aubin, New Britain, PA (US)

(73) Assignee: ORBIT Advanced Technologies, Inc., Horsham, PA (US)

( * ) Notice: Subject to any disclaimer, the term of this patent is extended or adjusted under 35 U.S.C. 154(b) by 0 days.

(21) Appl. No.: 12/864,398

(22) PCT Filed: Oct. 29, 2009

(86) PCT No.: PCT/US2009/062473
§ 371 (c)(1),
(2), (4) Date: Jul. 23, 2010

(87) PCT Pub. No.: WO2010/138139
PCT Pub. Date: Dec. 2, 2010

Related U.S. Application Data

(60) Provisional application No. 61/181,880, filed on May 28, 2009.

(51) Int. Cl.
*H01Q 17/00* (2006.01)
(52) U.S. Cl. .................. 342/4; 342/1
(58) Field of Classification Search .......... 342/1–4
See application file for complete search history.

(56) References Cited

U.S. PATENT DOCUMENTS

| | | | | | |
|---|---|---|---|---|---|
| 3,100,870 | A | * | 8/1963 | Smith | 455/67.12 |
| 3,113,271 | A | * | 12/1963 | Buckley | 455/63.1 |
| 3,120,641 | A | * | 2/1964 | Buckley | 455/128 |
| 3,836,967 | A | * | 9/1974 | Wright | 342/4 |
| 3,876,035 | A | * | 4/1975 | Eckel | 181/198 |
| 4,164,718 | A | * | 8/1979 | Iwasaki | 333/81 R |

(Continued)

FOREIGN PATENT DOCUMENTS

JP 04-169865 6/1992

(Continued)

OTHER PUBLICATIONS

Winebrand, Mark and Aubin, John, Low Frequency 3-D Electromagnetic Analysis of Anechoic Chamber Performance, Microwave Journal, Oct. 2008.

(Continued)

*Primary Examiner* — Thomas H Tarcza
*Assistant Examiner* — Peter Bythrow
(74) *Attorney, Agent, or Firm* — Michael Crilly, Esq.

(57) ABSTRACT

An electromagnetic absorber assembly capable of minimizing reflectivity caused by reflected and diffracted waves within a test chamber is presented. The absorber assembly includes a plurality of first wedges and a plurality of second wedges disposed in a symmetrical arrangement so as to form a continuous and smoothly changing v-shaped pattern along one or more walls of an anechoic test chamber. Each wedge has a triangular-shaped first end and second end formed by a pair of side walls and a base wall. One second end of each first wedge contacts and covers one first end of each second wedge along a contact plane. First and second wedges are disposed at a first angle and a second angle, respectively, about the contact plane in a symmetrical arrangement. The assemblies described could be installed on a flat or shaped absorber base or wall to divert reflected and refracted fields away from a quiet zone. Interplay between the shaped absorber base or wall and intersecting wedges facilitates minimization of clutter and secondary scattering.

20 Claims, 19 Drawing Sheets

U.S. PATENT DOCUMENTS

| | | | | |
|---|---|---|---|---|
| 4,496,950 A * | 1/1985 | Hemming et al. | | 342/4 |
| 4,507,660 A * | 3/1985 | Hemming | | 342/1 |
| 4,906,998 A * | 3/1990 | Shibuya | | 342/4 |
| 4,931,798 A * | 6/1990 | Kogo | | 342/4 |
| 5,373,296 A * | 12/1994 | Ishino et al. | | 342/4 |
| 5,492,749 A * | 2/1996 | Solves et al. | | 428/172 |
| 5,594,218 A * | 1/1997 | Diaz et al. | | 181/295 |
| 5,631,661 A * | 5/1997 | Sanchez | | 343/703 |
| 5,688,348 A * | 11/1997 | Diaz et al. | | 156/197 |
| 5,885,692 A * | 3/1999 | Imashiro et al. | | 428/159 |
| 6,008,753 A * | 12/1999 | Berg et al. | | 342/165 |
| 6,043,769 A * | 3/2000 | Rowe et al. | | 342/4 |
| 6,061,011 A * | 5/2000 | Yamamoto et al. | | 342/1 |
| 6,217,978 B1 * | 4/2001 | Murase et al. | | 428/116 |
| 6,371,240 B1 * | 4/2002 | Hayes et al. | | 181/30 |
| 6,373,425 B1 * | 4/2002 | Inoue et al. | | 342/1 |
| 6,437,748 B1 * | 8/2002 | Burnside et al. | | 343/703 |
| 6,771,204 B2 * | 8/2004 | Hayashi et al. | | 342/1 |
| 6,784,419 B1 * | 8/2004 | Hayashi et al. | | 250/250 |
| 6,793,037 B1 * | 9/2004 | Babuke et al. | | 181/293 |
| 7,479,917 B2 * | 1/2009 | Kurihara et al. | | 342/1 |
| 7,695,803 B2 * | 4/2010 | Kasabo et al. | | 428/182 |
| 2007/0030194 A1 * | 2/2007 | Kurihara et al. | | 342/1 |

FOREIGN PATENT DOCUMENTS

| | | |
|---|---|---|
| JP | 04-169866 | 6/1992 |
| JP | 07-212076 | 8/1995 |

OTHER PUBLICATIONS

Gau, Jiahn-Rong J., Burnside, Walter D., and Gilreath, Melvin, Chebyshev Multilevel Absorber Design Concept, IEEE Transactions of Antennas and Propagation, vol. 45, No. 8, Aug. 1997.

* cited by examiner $\alpha_1 = \alpha_2$ or $\alpha_1 \neq \alpha_2$

ABSORBER ASSEMBLY FOR AN ANECHOIC CHAMBER

CROSS REFERENCE TO RELATED APPLICATIONS

This application is based upon and claims priority from U.S. Provisional Application No. 61/181,880 filed May 28, 2009 and PCT Application No. PCT/US2009/062473 filed Oct. 29, 2009, both entitled Absorber Assembly for an Anechoic Chamber, which are hereby incorporated in their entirety by reference thereto.

FEDERALLY SPONSORED RESEARCH AND DEVELOPMENT

None.

BACKGROUND OF THE INVENTION

1. Field of the Invention

The invention generally relates to a device which minimizes reflectivity caused by reflected and diffracted waves within a test chamber. Specifically, the invention is a wave absorber assembly comprising a plurality of first wedge-shaped absorbers and a plurality of second wedge-shaped absorbers which are disposed so as to form a continuous and smoothly changing v-shaped pattern along the interior surface of planar or non-planar walls of an anechoic chamber. The arrangement of v-shaped absorbers improves control over reflectivity within a chamber so as to better control primary and secondary scattering effects which in turn improves quiet zone reflectivity and reduces quiet zone clutter.

2. Background

A typical anechoic chamber for electromagnetic compatibility (EMC), far-field (FF) antenna, or radar cross section (RCS) measurements includes a metallic enclosure with internal surfaces covered by an absorbing material. An anechoic chamber also contains a direct illumination source antenna, a compact range reflector system, and/or a feed, the latter employed within a tapered chamber. A chamber could also include positioning equipment to rotate an antenna under test so as to acquire pattern data, to rotate a device under test for electromagnetic compatibility measurements, or to acquire incident collimated wave signals during RCS measurements. The primary purpose of an anechoic chamber is to create a test zone surrounding the antenna or device under test wherein the electric field is as uniform as possible and reflections are minimized.

The performance of a test zone within an anechoic chamber depends on the geometry, size of the test zone as determined by the dimensions of the antenna or device under test, source antenna performance, separation between source and antenna/device under test, and absorption properties and grades of the absorbing materials lining the interior walls of the chamber.

For a conventional antenna/test item system, the dimensions of an anechoic chamber and choice of source antenna depend on the size of the test zone. Field uniformity within the test zone is primarily determined by the electric field amplitude and phase taper of the wave radiated into the test zone by the source antenna. Field uniformity is improved by increasing the separation distance between the source and antenna/device under test so as to decrease the amplitude and phase taper. Typically, the separation distance is greater than $2*D^2/\lambda$, where D is the maximum aperture dimension of the antenna or device under test and $\lambda$ is the operating wavelength. For large aperture antennas operating at higher frequencies, this distance is very large. However, the level of reflections from walls, floor, and ceiling increases with chamber length, thus offsetting the benefit of separation distance in many applications. As a result, test zone performance is a trade-off between the dimensions of the test zone and chamber geometry.

For a compact range system illumination of a test zone, a nearly uniform electric field can be achieved within the test zone. However, reflections from the chamber enclosure, even when covered by an absorbing material, negatively contribute to the uniformity of illumination within the test zone.

When RCS measurements are performed, echo signals are produced by scattering from the device under test. These signals travel along direct and indirect paths to the source antenna. The echo signals via indirect paths are often reflected from the walls of the chamber, and as such could contaminate measurements when not removed. Neither absorbing material nor time range gating is capable of completely removing or eliminating all unwanted echo signals. As such, some unwanted signals ultimately arrive back at the source antenna at approximately the same time as the return from the device under test, thus establishing the chamber background clutter level which limits the lowest RCS signal measurable.

For a tapered chamber system, reflections from the tapered walls covered by absorbing materials negatively contribute to the test zone, as described herein.

The requirements for test zone illumination and for the overall performance of anechoic chambers are becoming ever more stringent in response to advancements in antenna, RCS, and EMC technologies. Numerous approaches are described in the related arts to enhance the performance of anechoic chambers.

The shaping of surfaces in an anechoic chamber for EMC and antenna measurements are described by Smith in U.S. Pat. No. 3,100,870, Buckley in U.S. Pat. Nos. 3,113,271 and 3,120,641, Hemming in U.S. Pat. No. 4,507,660, Sanchez in U.S. Pat. No. 5,631,661, Shibuya in U.S. Pat. No. 4,906,998, Kogo in U.S. Pat. No. 4,931,798, and Berg et al. in U.S. Pat. No. 6,008,753. Shaping facilitates a reflecting screen or wall that deflects reflected energy from the chamber wall, typically comprising an absorber element and metallic backing, away from the test zone, thus reducing reflectivity levels within the test zone, minimizing or avoiding specular zones on the side walls, and avoiding the need for absorbing materials along some areas of a chamber. For example, Shibuya describes the use of shaping to deflect unwanted radiation towards the open walls outside of a chamber and away from the test zone. In another example, Kogo describes the use of shaping so that reflections from walls are focused at some place within the chamber outside of the test zone, usually behind the test zone. Insertion of an absorption "ball" at this location further reduces echoes within the chamber. In another example, Berg et al. describes the use of shaping so that the echo signals reflected by the device under test, and subsequently by the side walls, are focused at a point located behind the source antenna, thus minimizing the clutter level in RCS measurements.

Other inventions in the related arts have focused on the design of absorber elements. Most absorber designs assume a flat metallic backing along the absorber and ignore detailed consideration of the scattering effect. For example, Hemming et al. in U.S. Pat. No. 4,496,950 describes shaped absorber components to create normal or close to normal incident angles, thus improving absorption. In another example, Burnside et al. in U.S. Pat. No. 6,437,748 suggests the use of an R-card or "Chebyshev" pattern. This latter approach assumes the absorber is highly efficient and performance does not depend on a metallic backing plate.

The inventions described above are broadly based on the principles of Geometrical Optics approximation. As applied to anechoic chamber design, these principles assume that the walls of a chamber, even when covered by a highly efficient absorbing material, reflect a maximum signal level at about the same angle as the arrival angle of the incident wave. As such, the related arts have focused on minimizing the specular reflection of waves within an anechoic chamber into a test zone, while ignoring the causes and influences of diffracted waves. Furthermore, the related arts make no effort to control the diffracted waves in a primary scattered field resulting from the first impingement of a wave onto an absorber and the diffracted waves in a secondary scattered field resulting from the further impingement of the primary scattered field onto an absorber, test item, and/or source within a chamber. Accordingly, all presently known applications of absorbers within a test chamber do not adequately control the reflection and scattering of electromagnetic waves.

Therefore, what is required is an absorber assembly which accounts not only for specular reflections, but also for the primary and secondary scattered fields caused by diffraction within an anechoic chamber so as to better control the reflected fields therein.

SUMMARY OF THE INVENTION

An object of the present invention is to provide an absorber assembly which accounts not only for wall specular reflections, but also for the primary and secondary scattered fields caused by diffraction within an anechoic chamber so as to better control the reflected fields and direct them away from the quiet zone during EMC and antenna measurements and from the quiet zone and source during RCS measurements.

In accordance with embodiments of the invention, the apparatus includes a plurality of first wedges and a plurality of second wedges capable of absorbing electromagnetic energy. The first and second wedges are arranged so as to form a continuous repeating and/or smoothly changed pattern which is substantially v-shaped. Each first and second wedge has a triangular or like-shaped cross section with a pair of side walls and a base wall bound between a first end and a second end. One second end of each first wedge contacts and covers one first end of each second wedge along a contact plane. The first and second wedges are disposed at an angle about the contact plane in a symmetrical or asymmetrical arrangement, so that the resultant angle is greater than 0° but less than 180°. Wedges may be directly or indirectly attached to a flat or shaped wall.

Several advantages are offered by the invention. The invention minimizes the level of test zone reflectivity, so as to facilitate a larger test zone. The invention extends test zone performance to include lower frequencies than otherwise achievable with similarly dimensioned anechoic chambers of conventional design. The invention minimizes chamber size and volume for a given minimum level of reflectivity and test zone size, thereby lowering chamber implementation costs. The invention is based upon Geometrical Optics and Geometrical Theory of Diffraction, so as to account not only for specular reflections, but also for the overall combined diffraction of waves from a wedge. The invention facilitates a plurality of solutions within a chamber so as to optimize reflectivity and control the path of diffracted waves within all scattered fields.

BRIEF DESCRIPTION OF THE INVENTION

Additional aspects, features, and advantages of the invention will be understood and will become more readily apparent when the invention is considered in the light of the following description made in conjunction with the accompanying drawings.

Figure 10:
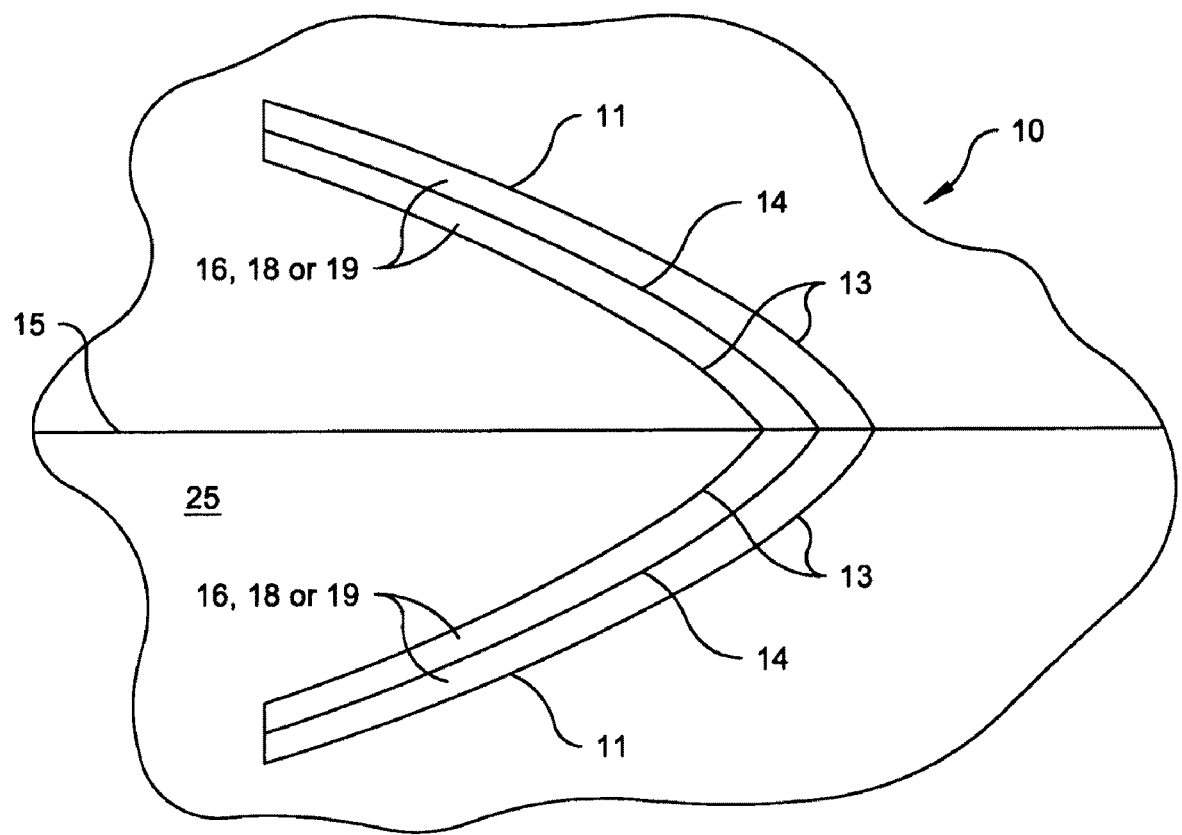

FIG. 10 a frontal view of an absorber assembly illustrating a paired arrangement of one set of arcuate-shaped wedges (other wedges are not shown) wherein curvature is disposed along the plane of the base wall in accordance with an embodiment of the invention.

Figure 11:
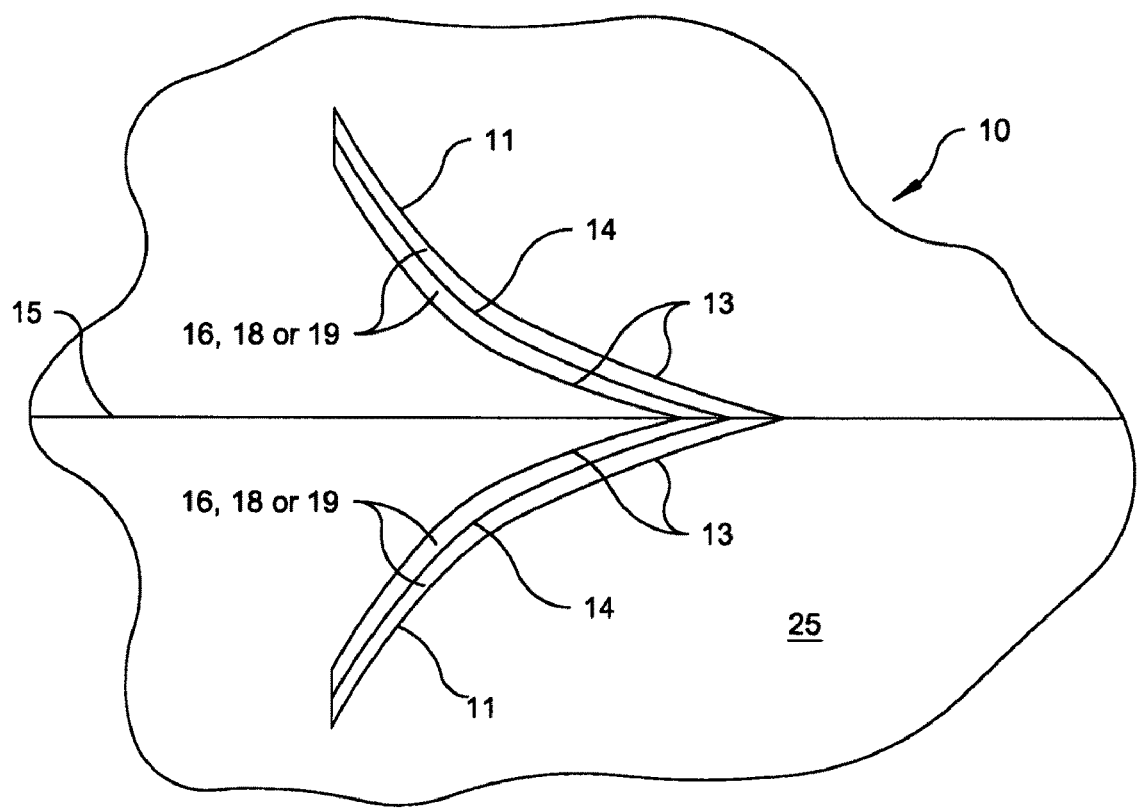

FIG. 11 a frontal view of an absorber assembly illustrating a paired arrangement of one set of arcuate-shaped wedges (other wedges are not shown) wherein curvature is disposed along the plane of the base wall in accordance with an embodiment of the invention.

Figure 12:
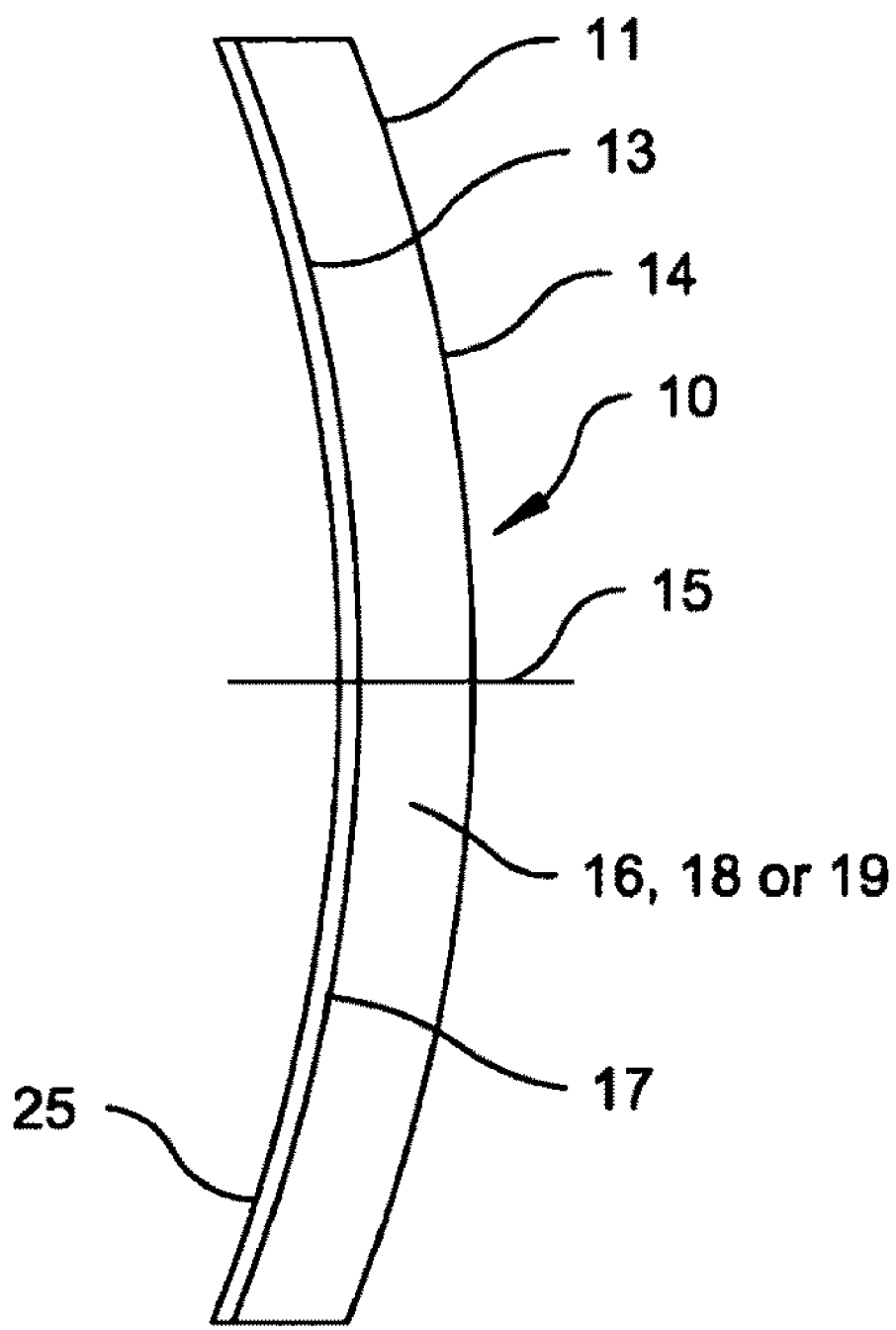

FIG. 12 is a side view of an absorber assembly illustrating a paired arrangement of arcuate-shaped wedges wherein curvature is disposed along the plane perpendicular to the base wall in accordance with an embodiment of the invention.

Figure 13:
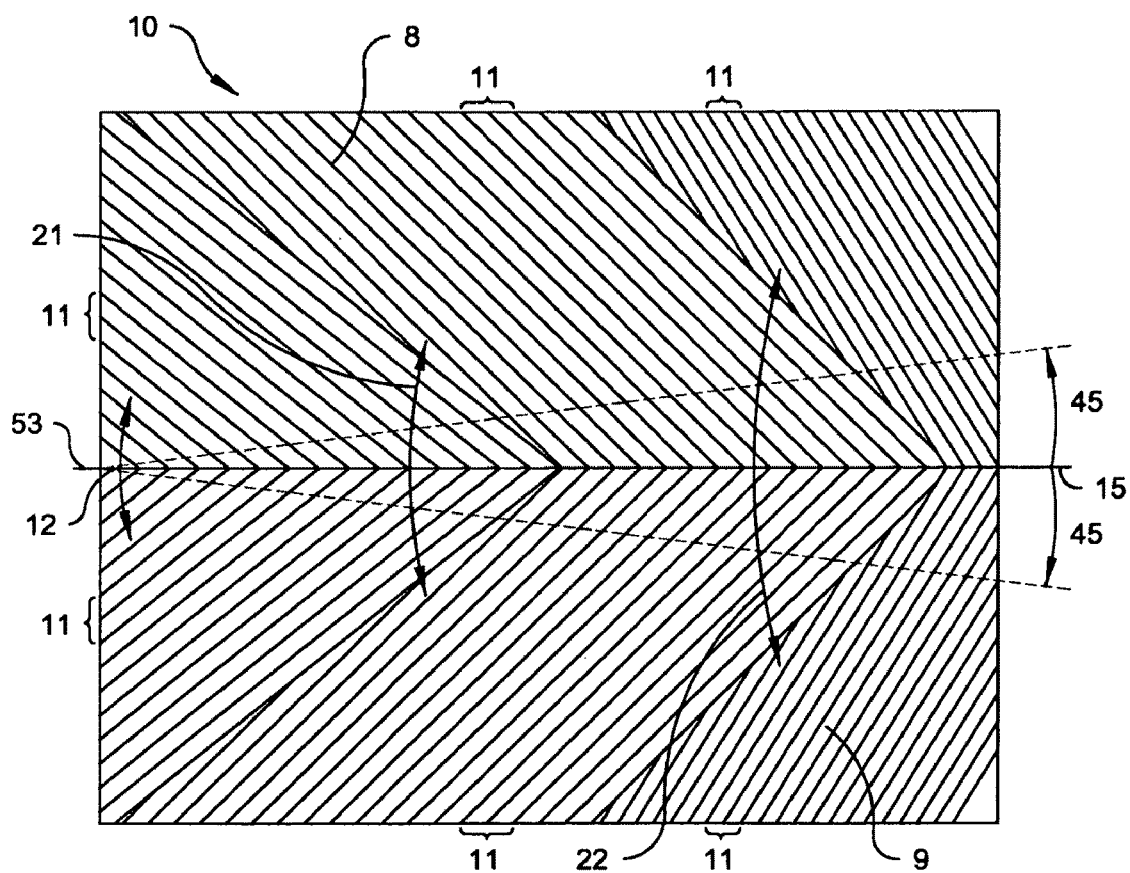

FIG. 13 is a frontal view of an absorber assembly illustrating a paired arrangement of wedges wherein the angle formed by intersecting wedges varies along the length of the assembly in accordance with an embodiment of the invention.

Figure 14A:
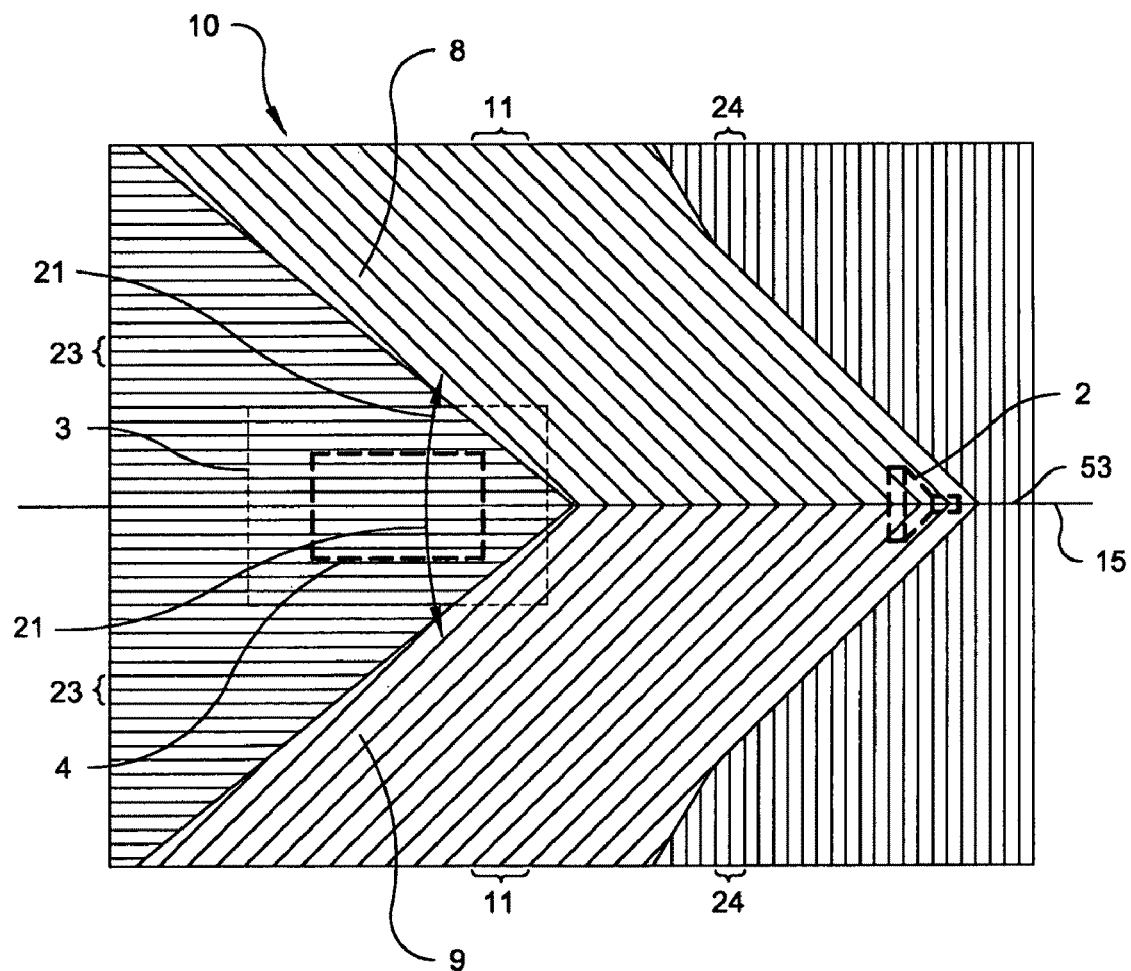

FIG. 14a is a frontal view of an absorber assembly illustrating the paired arrangement of wedges in the center of the assembly and disposed between horizontal and vertical wedges in accordance with an embodiment of the invention.

Figure 14B:
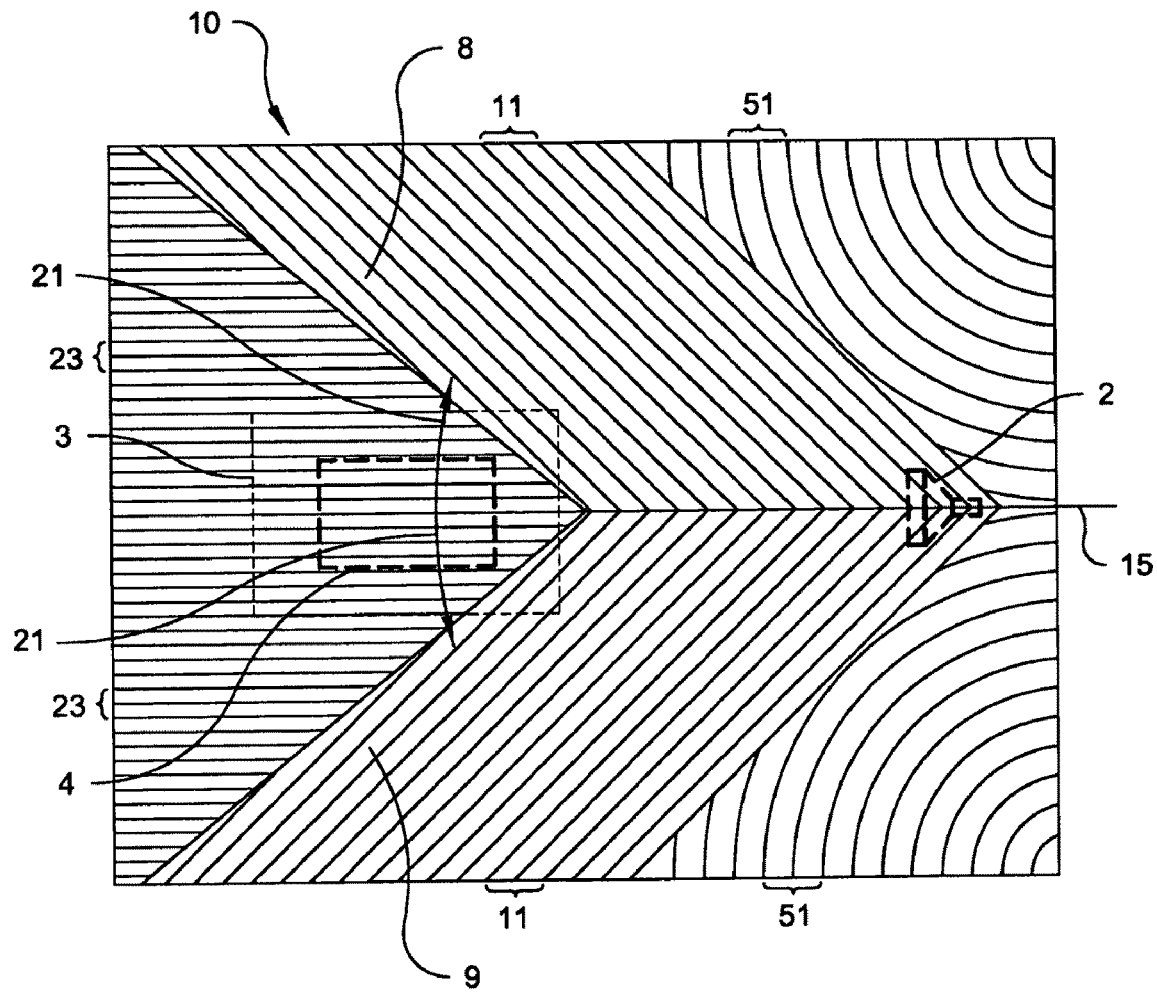

FIG. 14b is a frontal view of an absorber assembly illustrating the paired arrangement of wedges in the center of the assembly and disposed between horizontal and curvilinear wedges in accordance with an embodiment of the invention.

Figure 15:
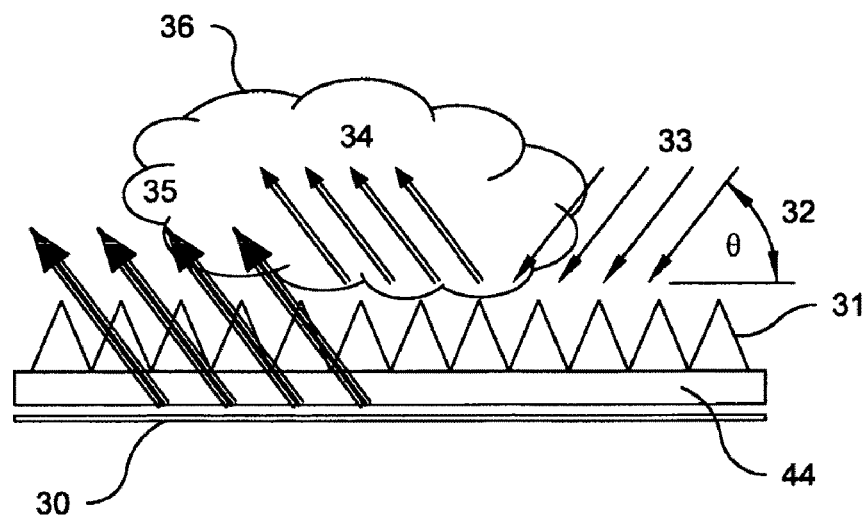

FIG. 15 is a schematic diagram illustrating the reflection of an incident wave from pyramidal-shaped elements.

Figure 16:
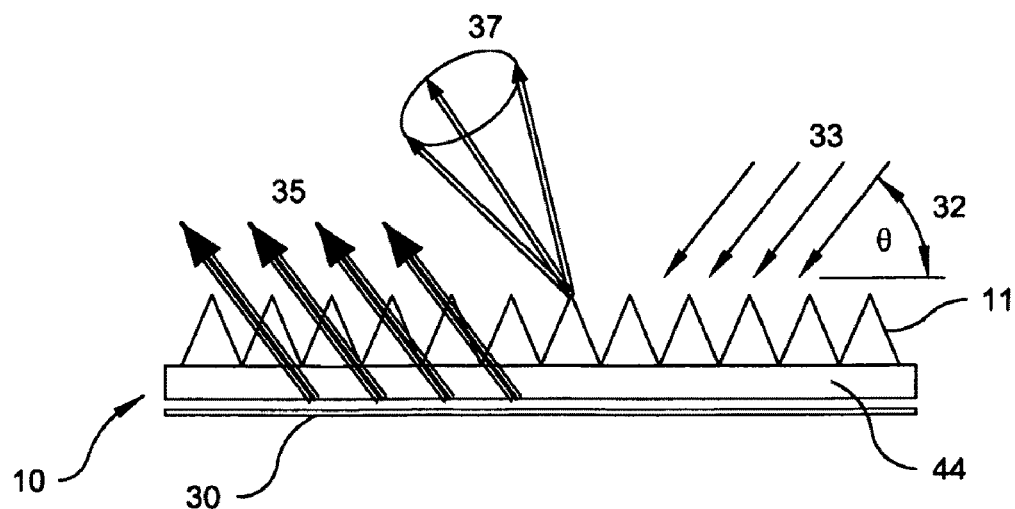

FIG. 16 is a schematic diagram illustrating the reflection and diffraction of an incident wave from an absorber assembly comprised of wedges arranged in a v-shaped pattern in accordance with an embodiment of the invention.

Figure 17:
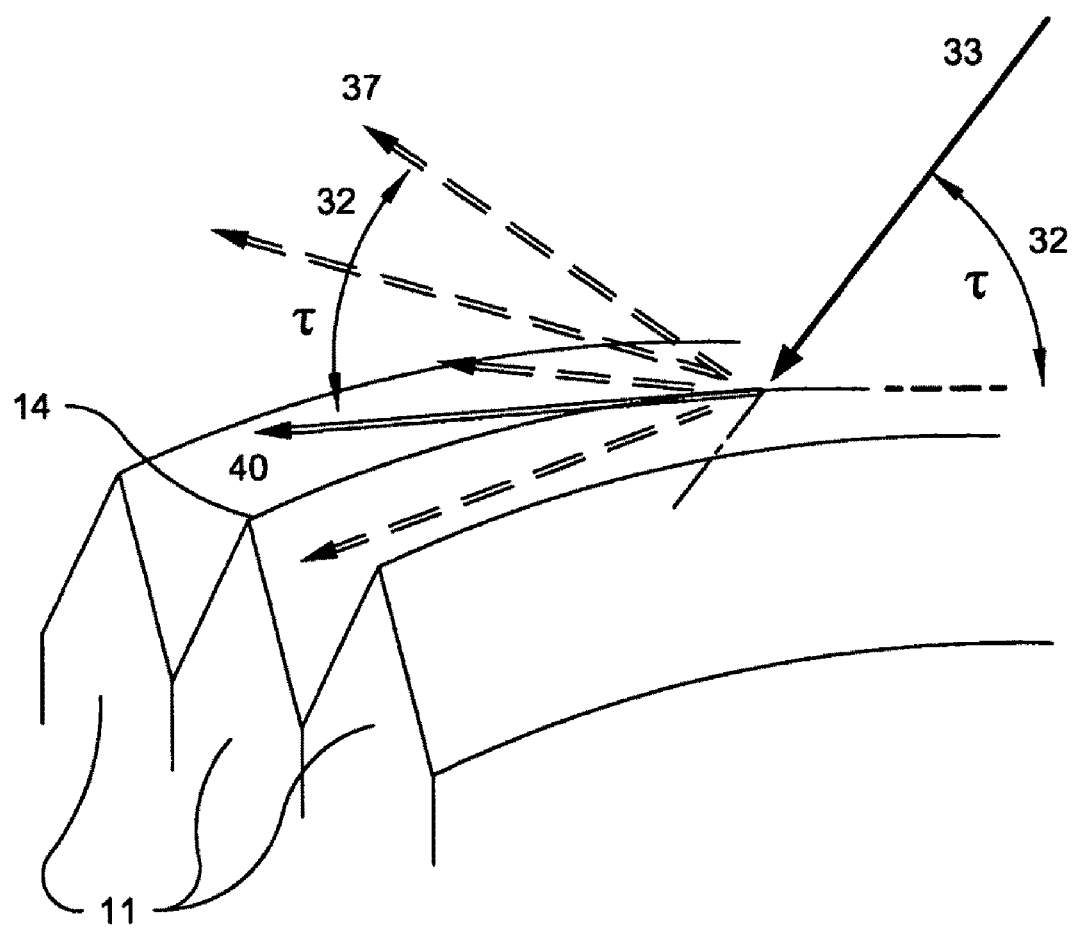

FIG. 17 is a schematic diagram illustrating the diffraction of an incident wave from the ridge line of a wedge in accordance with an embodiment of the invention.

Figure 18:
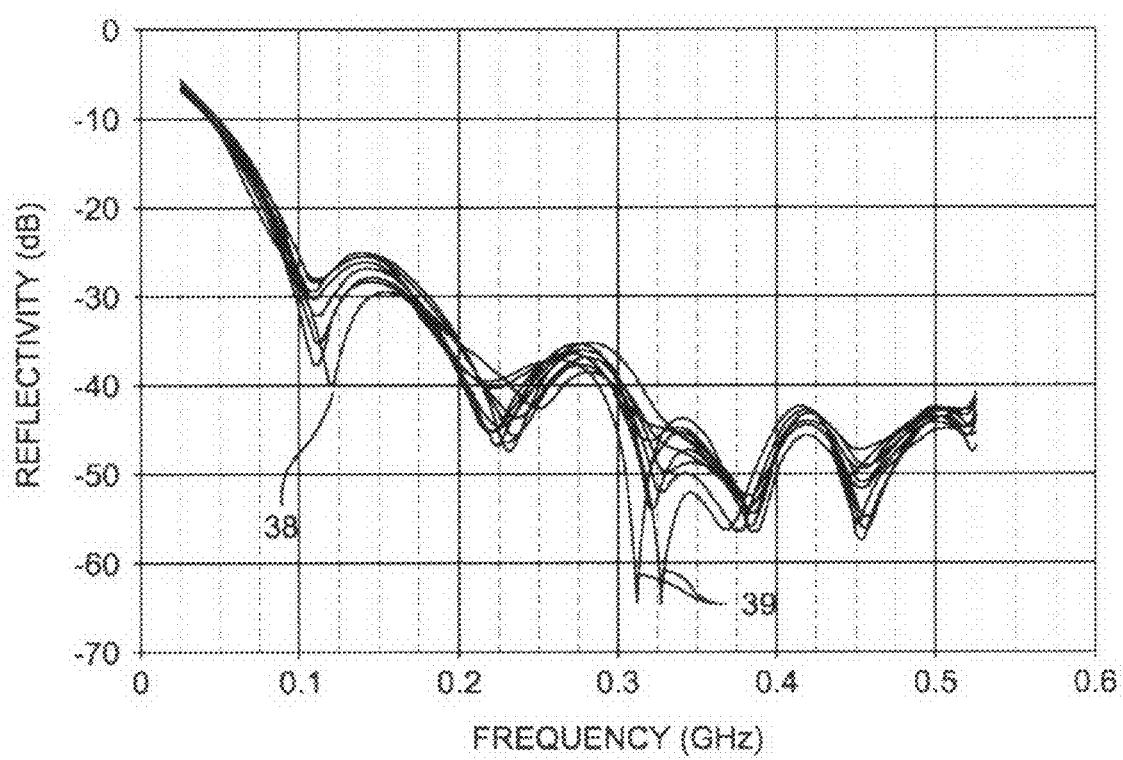

FIG. 18 is a reflectivity versus frequency plot for an absorber assembly in accordance with an embodiment of the invention.

Figure 19A:
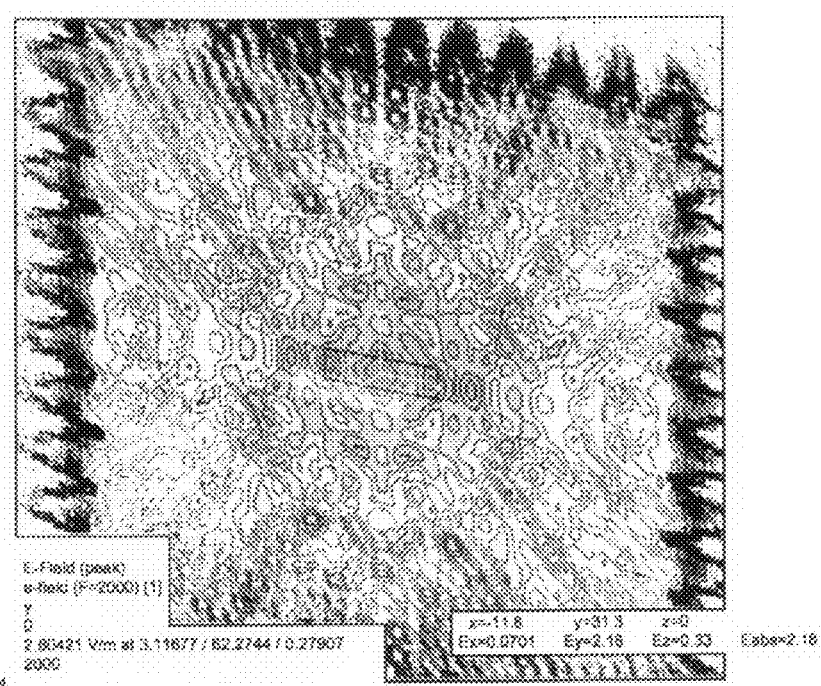

FIG. 19a is a contour plot of reflectivity through the center of a test zone within a rectangular-shaped anechoic chamber lined with pyramidal absorbers.

Figure 19B:
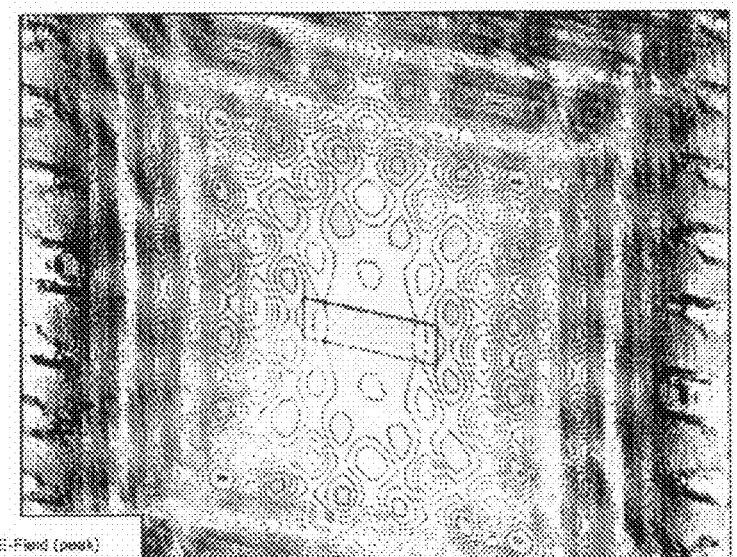

FIG. 19b is a contour plot of reflectivity through the center of a test zone within a rectangular-shaped anechoic chamber lined with intersecting wedges arranged in a v-shaped pattern along shaped walls in accordance with an embodiment of the invention.

Figure 20:
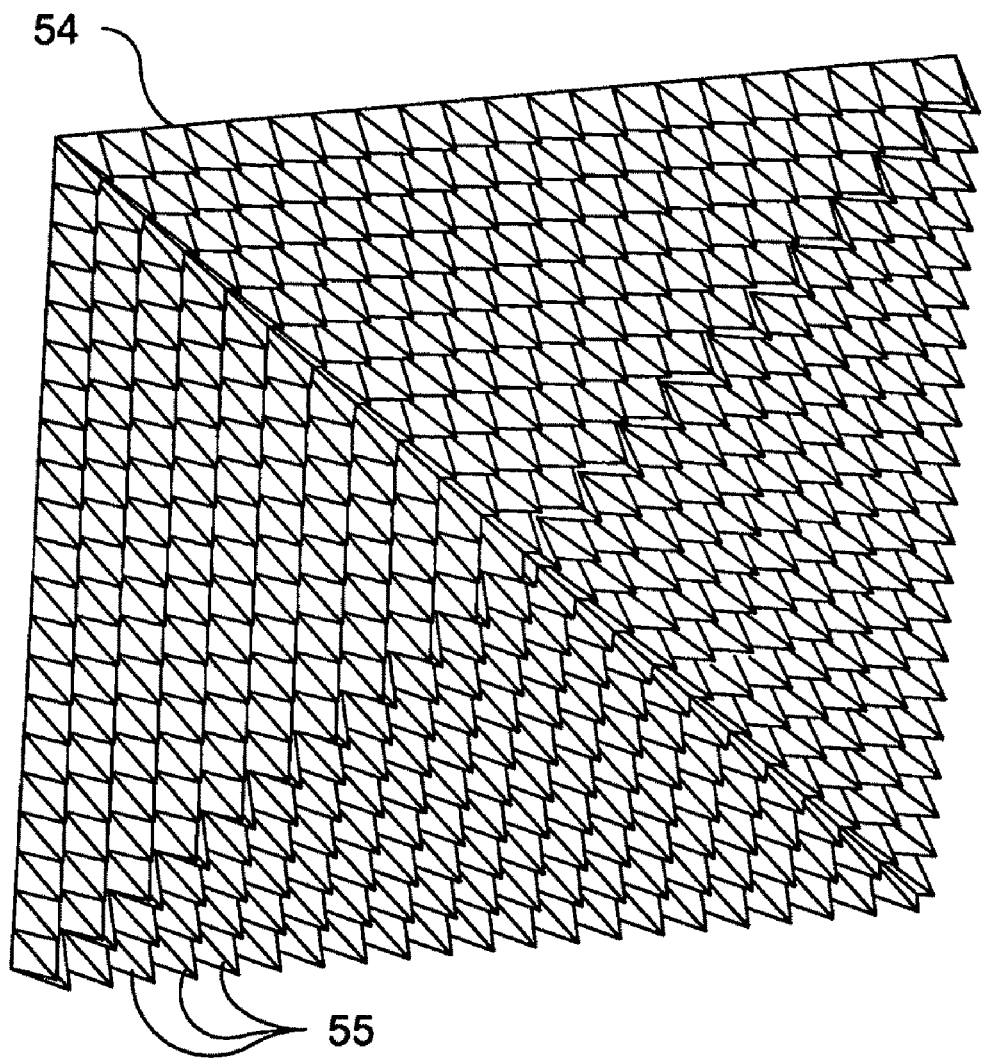

FIG. 20 is a perspective view of a pyramid-shaped end wall illustrating the arrangement of a plurality of pyramid-shaped absorber elements in accordance with an embodiment of the invention.

DETAILED DESCRIPTION OF THE INVENTION

Reference will now be made in detail to several preferred embodiments of the invention that are illustrated in the accompanying drawings. Wherever possible, same or similar reference numerals are used in the drawings and the description to refer to the same or like parts. The drawings are not to precise scale. While features of various embodiments are separately described throughout this document, it is understood that two or more such features could be combined into a single embodiment.

Figure 1:
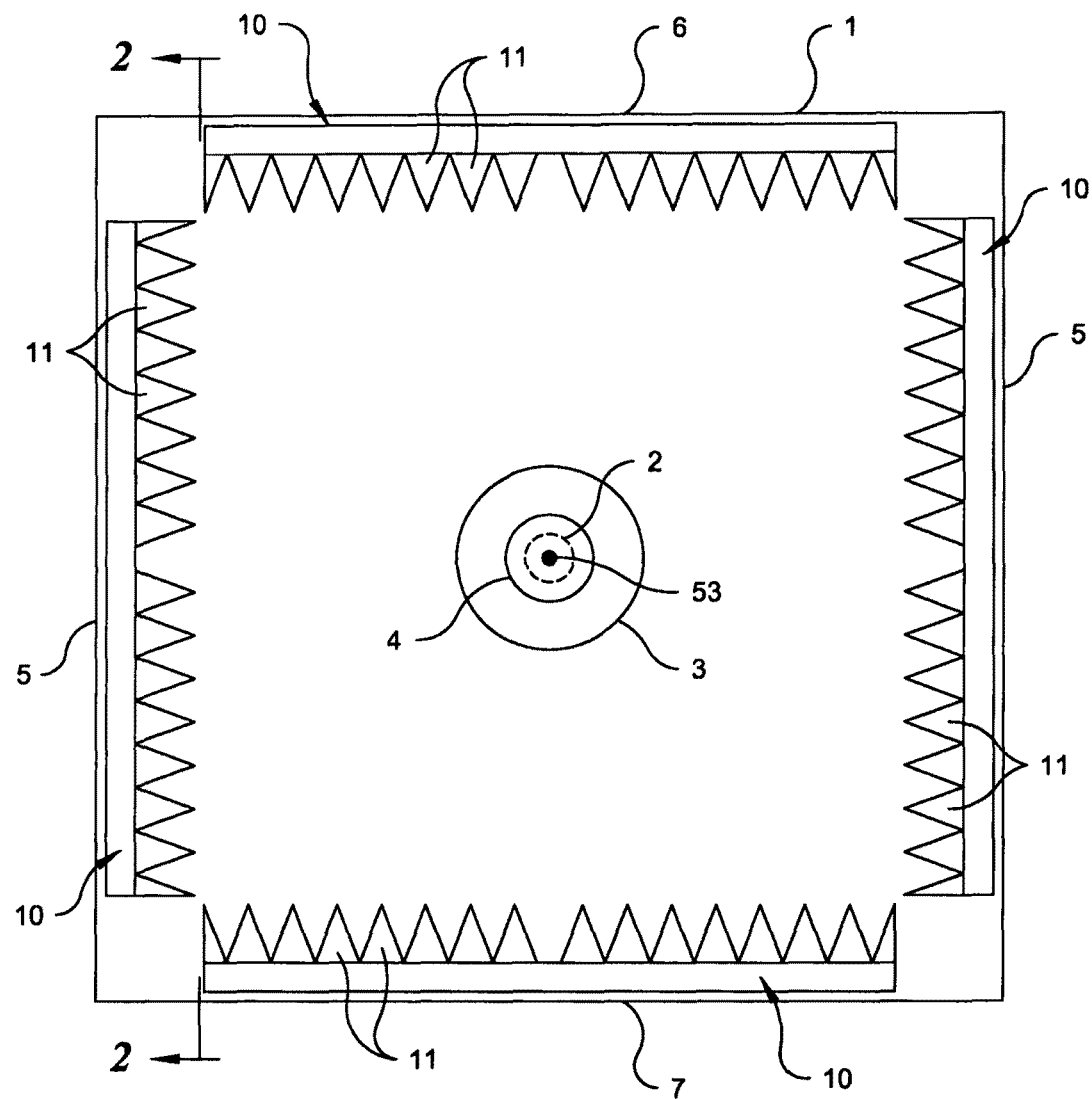
FIG. 1 is an end view of an anechoic chamber from the perspective of the end or back wall illustrating arrangement of absorber assemblies with wedges arranged in a continuous and smoothly changing v-shaped pattern along the top, bottom, and side walls in accordance with an embodiment of the invention.

Referring now to FIG. 1, the interior of a test chamber 1 is shown from the perspective of one end showing the location and arrangement of absorber assemblies 10, a source 2, a quiet zone 3, and a test item 4. The test chamber 1 could include a variety of configurations understood in the art, examples including conventional rectangular, compact range, and tapered chambers. Absorber assemblies 10 are attached to the interior surface of the side walls 5, top wall, 6, and bottom wall 7. Each absorber assembly 10 includes a plurality of triangular or like-shaped wedges 11. The absorber assemblies 10 could completely or partially cover one or more interior surfaces within the test chamber 1.

Absorber assemblies 10 and wedges 11 are understood to be composed of materials understood in the art, examples including but not limited to foam or a combination of ferrite and foam, fabricated via methods understood in the art. The source 2 is understood to be an antenna or other device which emits electromagnetic waves or the like. For example, the source 2 could be a direct illumination antenna or horn antenna. The test item 4 is understood to include either a device or antenna under test.

Figure 2A:
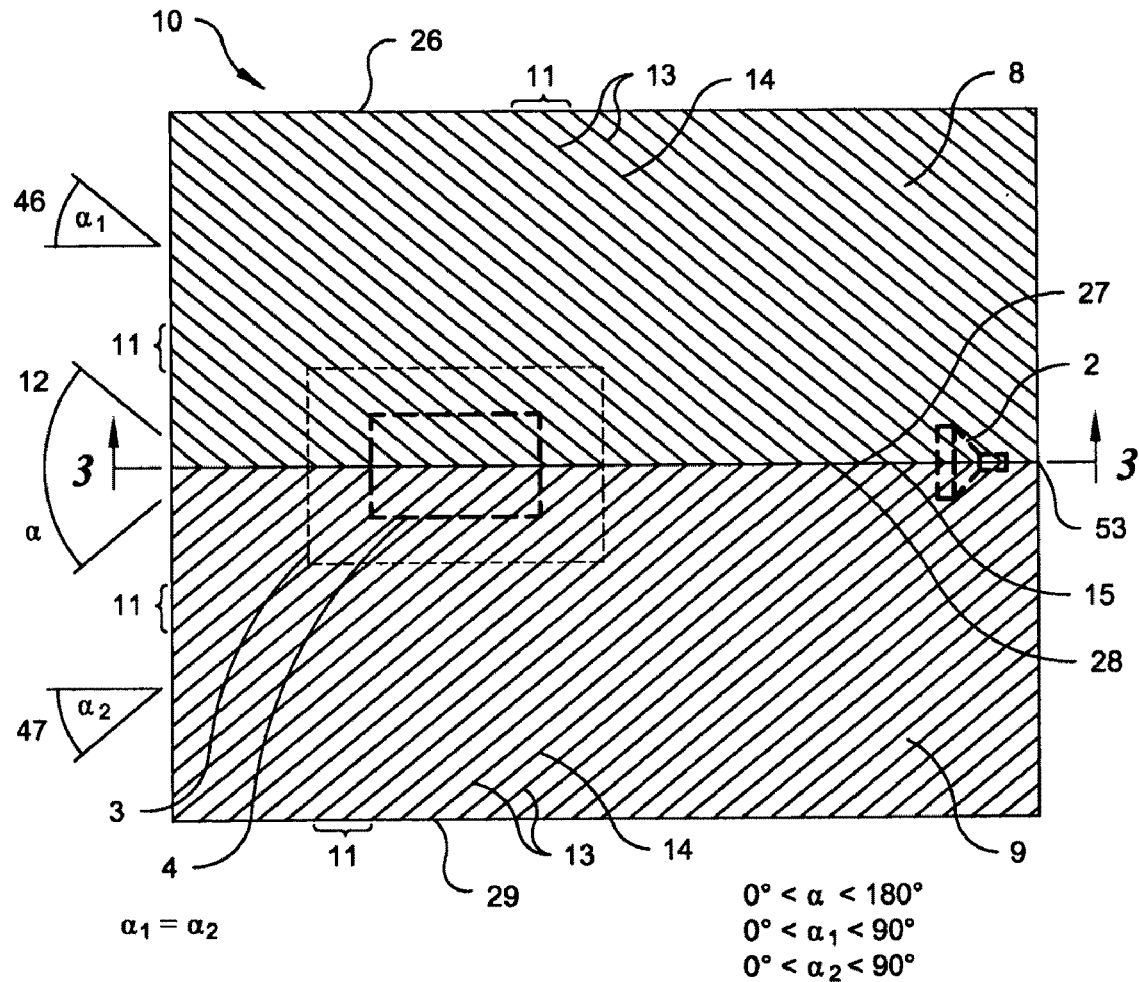
FIG. 2a is a frontal view of an absorber assembly along view 2-2 in FIG. 1 illustrating arrangement of wedges in a symmetrical v-shaped pattern in accordance with an embodiment of the invention.

Referring now to FIG. 2a, an absorber assembly 10 is shown including a plurality of wedges 11 disposed in a symmetrical arrangement about a contact plane 15 and at the same height as the centerline 53 through a source 2 and a test item 4. The contact plane 15 may be linear or non-linear. The wedges 11 are further divided into a first group 8 and a second group 9. The first group 8 is arranged at a first angle 46 ($\alpha_1$) so that the base lines 13 and ridge line 14 of the each wedge 11 are oriented to the left. The second group 9 is arranged at a second angle 47 ($\alpha_2$) so that the base lines 13 and ridge line 14 of each wedge 11 are oriented to the right. The sum of the first and second angles 46, 47 is equal to the wedge angle 12 ($\alpha$). In preferred embodiments, the first angle 46 is equal to the second angle 47 so that the first and second groups 8, 9 form a geometric pattern which is substantially symmetric about the contact plane 15. When used in conjunction with wall shaping, the cones of diffracted rays projected from the wedges 11 reduce intersects with the quiet zone 3 and test item 4 during EMC and antenna measurements and the rays reflected by the test item 4 and walls 5, 6, 7, reduce intersects with the source 2 during RCS measurements.

The intersection of two wedges 11 forms a v-shaped structure. The v-shaped structure is continuously repeated or smoothly changes along the length of the absorber assembly 10 by the intersection of the parallel wedges 11 comprising the first and second groups 8, 9. This arrangement also provides base lines 13 and a ridge line 14 which are v-shaped and contiguous along the length of each pair-wise arrangement of wedges 11.

Each wedge 11 comprising the first group 8 includes a first end 26 and a second end 27. Each wedge 11 comprising the second group 9 includes a first end 28 and a second end 29. The second end 27 of one wedge 11 in the first group 8 contacts and is attached to a first end 28 of one wedge 11 in the second group 9.

Figure 3:
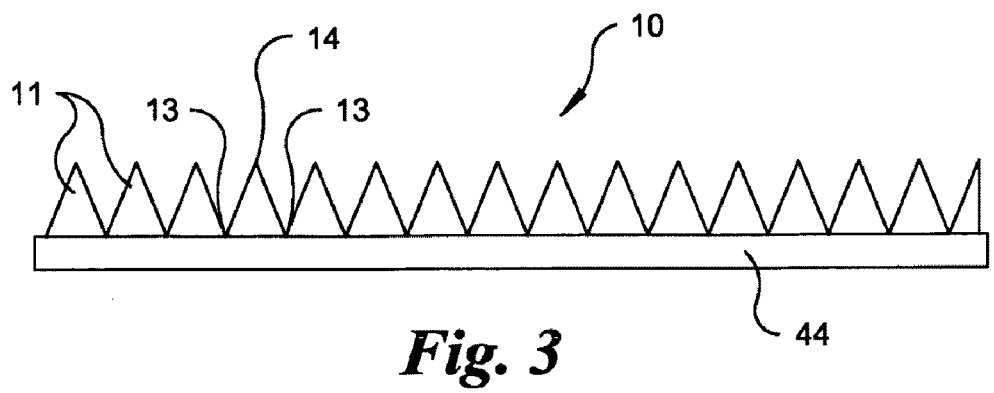
FIG. 3 is a sectional view of an absorber assembly along view 3-3 in FIG. 2a illustrating the triangular-shaped interface between intersecting wedges along a contact plane in accordance with an embodiment of the invention.

When the first angle 46 ($\alpha_1$) and second angle 47 ($\alpha_2$) are equal, the triangular-shaped ends of the contacting wedges 11 overlap in a complimentary arrangement, as represented in FIG. 3. The cross section of each wedge 11 can include a variety of shapes including those in FIGS. 7a, 7b, 8, and 9. The wedges 11 could be mechanically or adhesively fastened to an absorber base 44, also represented in FIG. 3, and to one another along the contact plane 15. The end-to-end arrangement of wedges 11 in a pair-wise fashion restricts the wedge angle 12 to a value greater than 0° and less than 180°, where the first and second angles 46, 47 are disposed at an angle greater than 0° and less than 90°. The first end 26 and second end 29 are appropriately angled so as to align with the edges of the absorber base 44. The second end 27 and first end 28 are appropriately angled so as to facilitate complimentary contact along the interface between two contacting wedges 11.

Figure 2B:
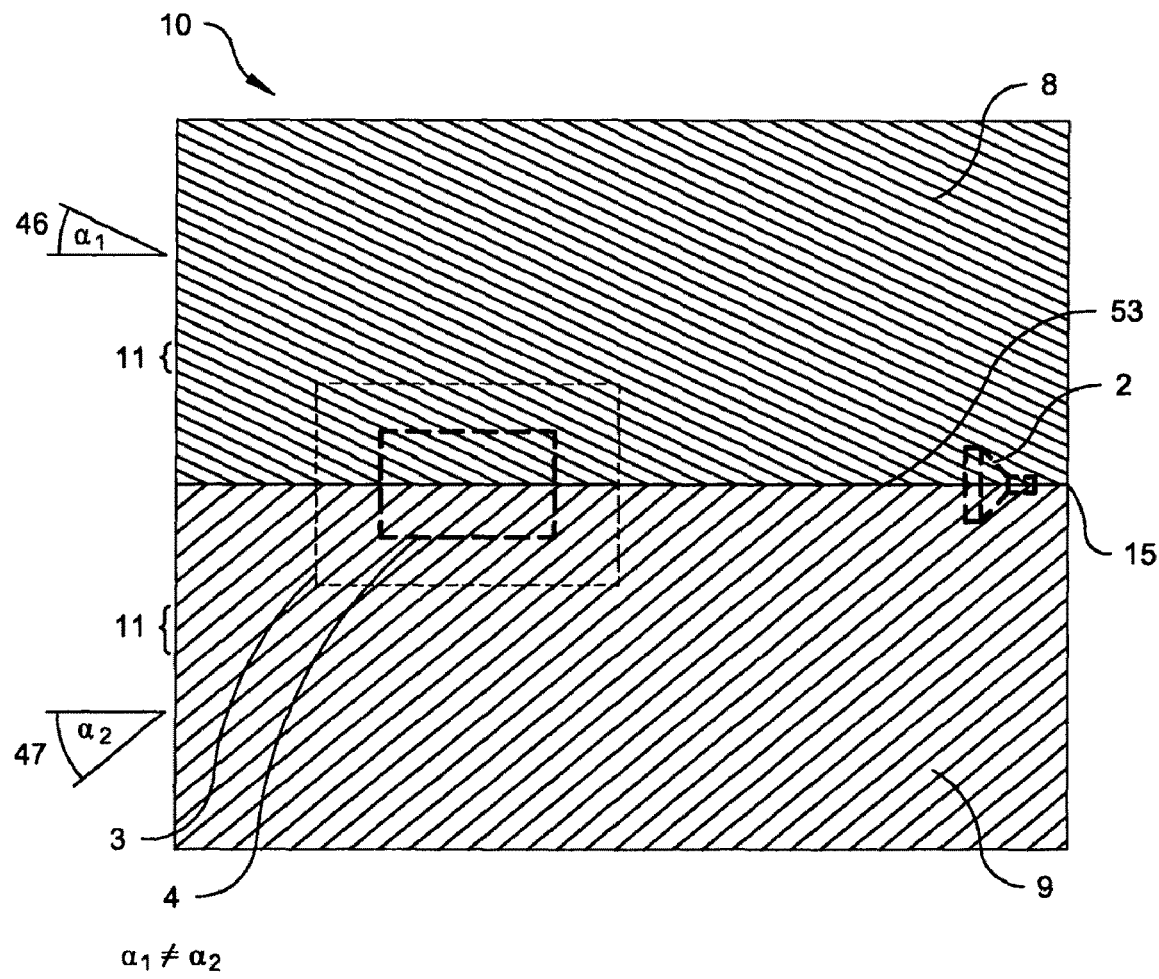
FIG. 2b is a frontal view of an absorber assembly along view 2-2 in FIG. 1 illustrating arrangement of wedges in an asymmetrical v-shaped pattern in accordance with an embodiment of the invention.

In some embodiments, the wedges 11 in the first group 8 could be oriented at an angle greater or less than that of the second group 9, as generally represented in FIG. 2b. The intersection of wedges 11 along the contact plane 15 could allow along a profile which is generally v-shaped with arbitrary cross section, however, including a pair of side walls 16 which are asymmetrically shaped.

Figure 2C:
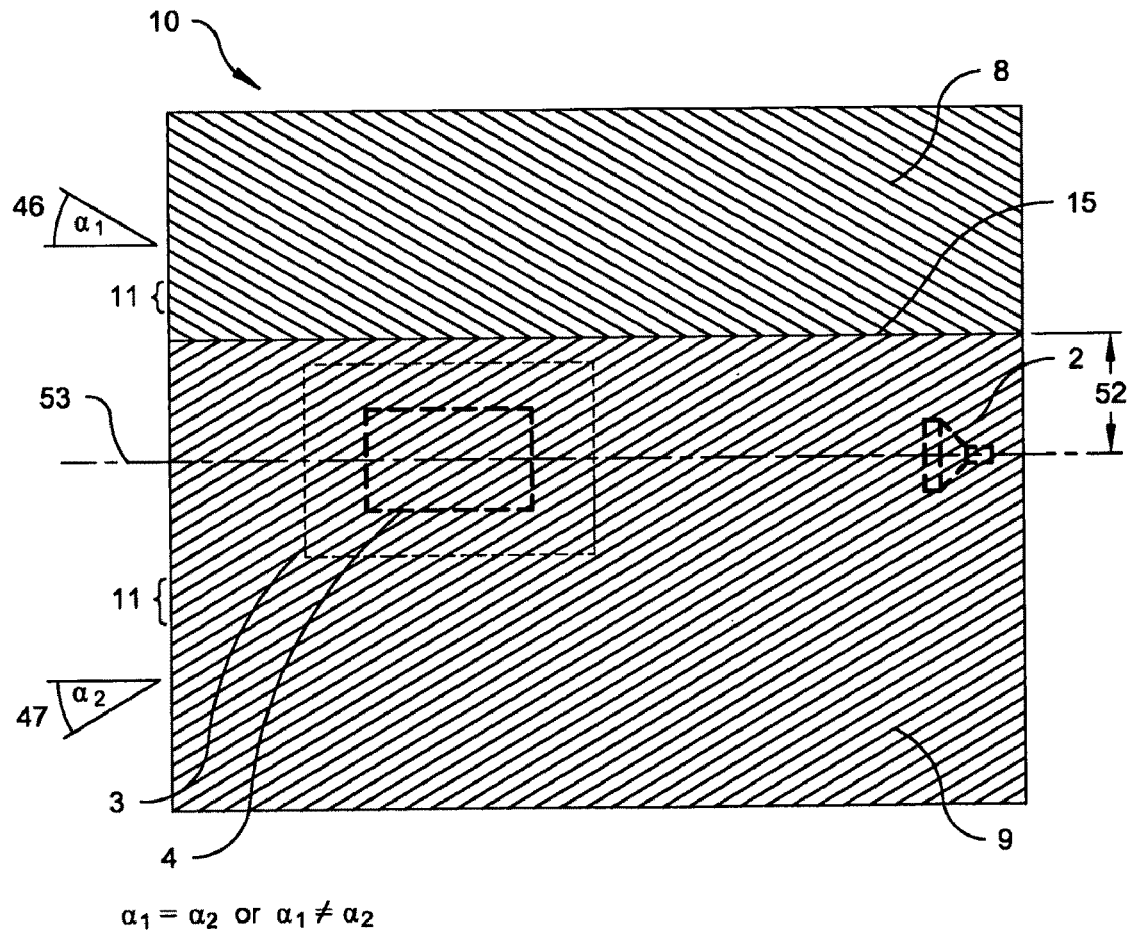
FIG. 2c is a frontal view of an absorber assembly along view 2-2 in FIG. 1 illustrating arrangement of wedges in a v-shaped pattern offset above a centerline through source, test item, and quiet zone in accordance with an embodiment of the invention.

In other embodiments, the wedges 11 could intersect along a contact plane 15 which is biased above or below the centerline 53, as represented in FIG. 2c. The offset 52 between contact plane 15 and centerline 53 would be design dependent. The first angle 46 and second angle 47 could be equal to provide for a generally symmetrical arrangement of wedges 11 about the contact plane 15 or not equal to provide an asymmetrical arrangement.

Figure 2D:
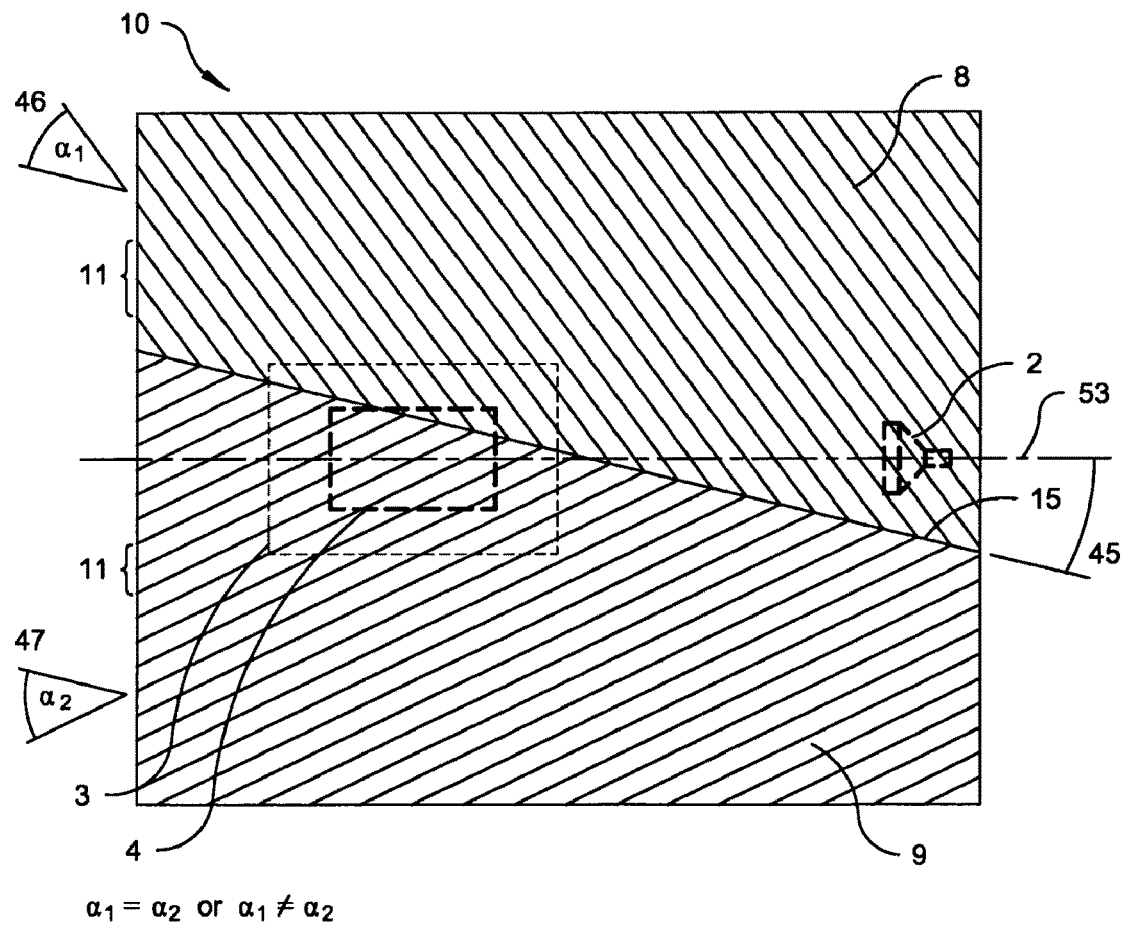
FIG. 2d is a frontal view of an absorber assembly along view 2-2 in FIG. 1 illustrating arrangement of wedges in a v-shaped pattern about a skewed contact plane in accordance with an embodiment of the invention.

In yet other embodiments, the intersecting wedges 11 could contact along a contact plane 15 which is skewed at a skew angle 45 with respect to the centerline 53, as represented in FIG. 2d. The first angle 46 and second angle 47 could be equal to provide for a generally symmetrical arrangement of wedges 11 about the contact plane 15 or not equal to provide an asymmetrical arrangement.

Figure 4:
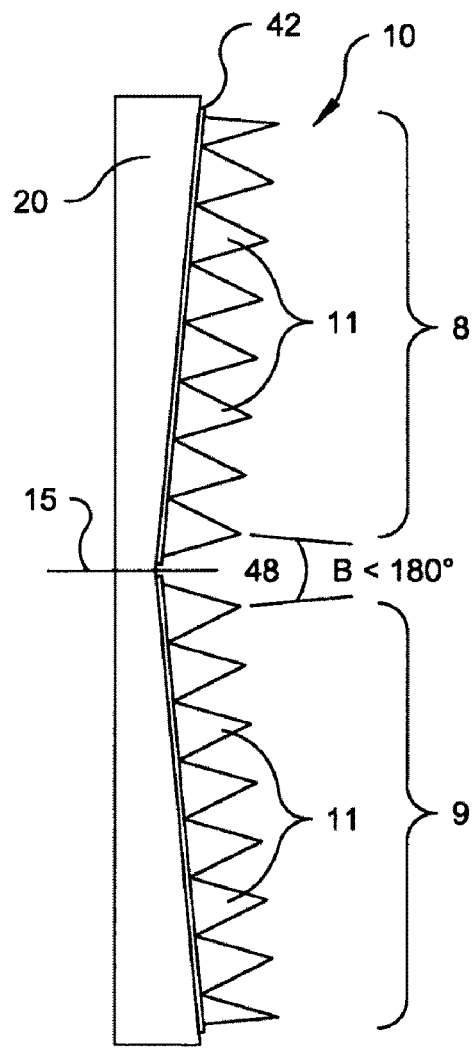
FIG. 4 is a side view of an absorber assembly with wedges illustrating attachment to a wall with a surface having an inward angular profile in accordance with an embodiment of the invention.
Figure 5:
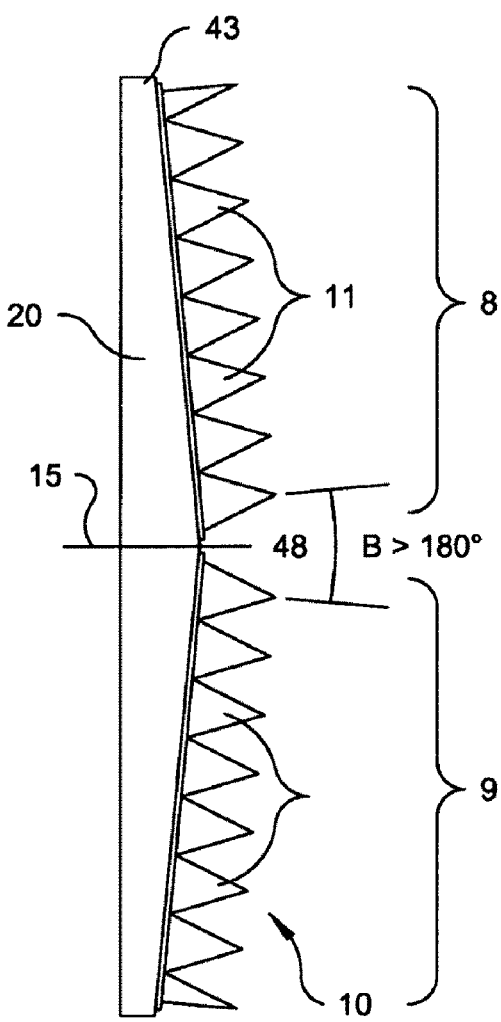
FIG. 5 is a side view of an absorber assembly with wedges illustrating attachment to a wall with a surface having an outward angular profile in accordance with an embodiment of the invention.

In still other embodiments, it might be advantageous to include either an inward or outward arrangement of wedges 11 along an absorber assembly 10. Referring now to FIGS. 4 and 5, the first and second groups 8, 9 are shown attached to a wall 20 having a concave surface 42 and a convex surface 43, respectively. In FIG. 4, wedges 11 within the first group 8 are positioned along the portion of the wall 20 oriented downward and wedges 11 forming the second group 9 are positioned along the portion of the wall 20 oriented upwards about the contact plane 15, resulting in an effective angle 48 (β) less than 180° measured from projections perpendicular to the concave surface 42. In FIG. 5, wedges 11 within the first group 8 are positioned along the portion of the wall 20 oriented upwards and wedges 11 in the second group 9 are positioned along the portion of the wall 20 oriented downwards about the contact plane 15, resulting in an effective angle 48 (β) greater than 180° measured from projections perpendicular to the convex surface 43. The effective angle 48 is chosen such that a normal vector at any point along the shaped surface is at least tangent to or does not intersect the quiet zone 3.

Figure 6:
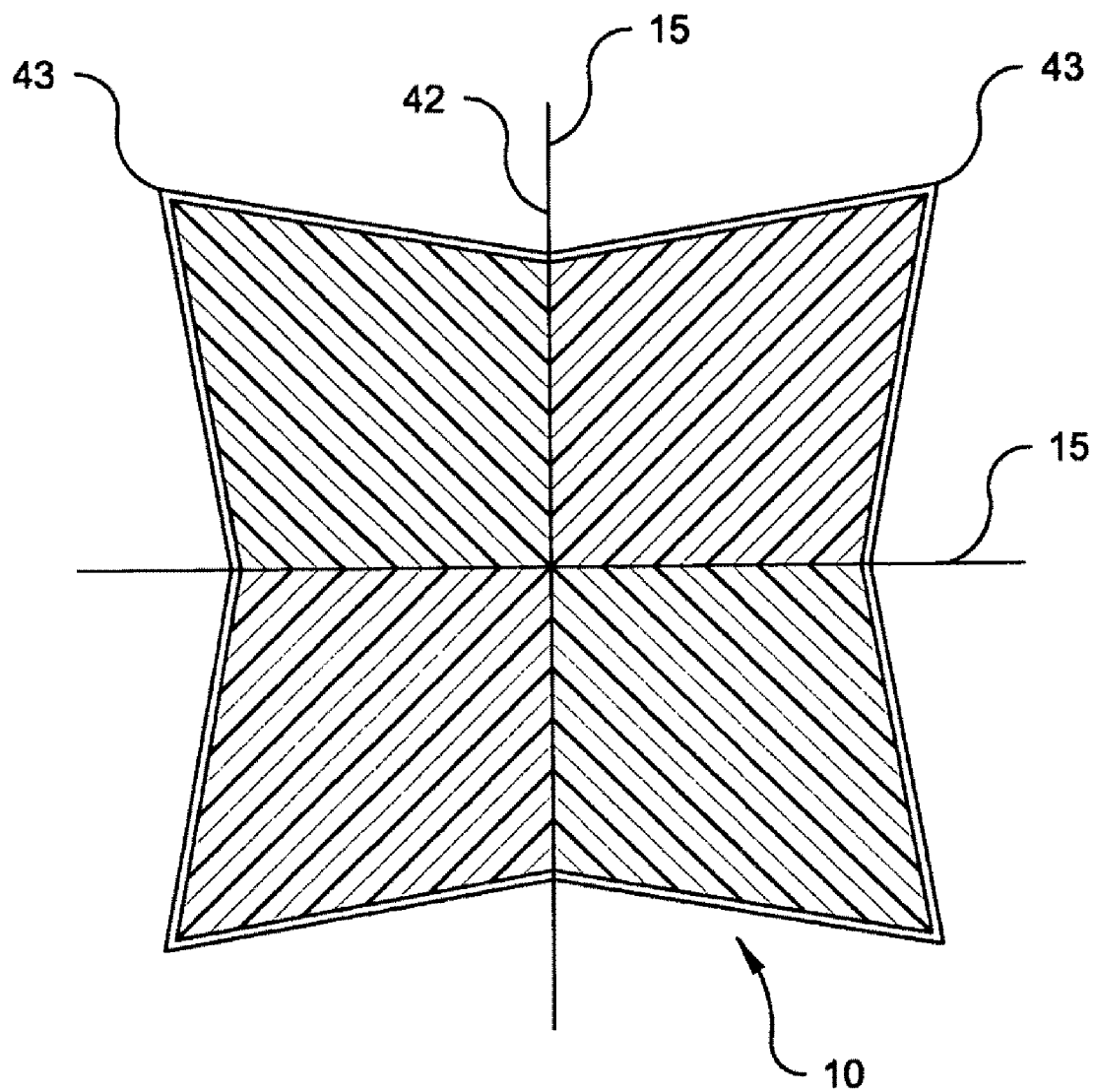
FIG. 6 is a frontal view of a four-fold absorber assembly illustrating both inward and outward angular features along a single wall in accordance with an embodiment of the invention.

The intersecting wedges 11 could also be disposed along any wall which includes both concave surfaces 42 and convex surfaces 43 and two or more contact planes 15. In FIG. 6, concave surfaces 42 are disposed along the contact planes 15 and convex surfaces 43 are disposed along a forty-five degree (45°) angle with respect to the contact planes 15; however, other arrangements are possible. The combination of surfaces along a single absorber assembly 10 could be used along the front, back, and/or other walls of a chamber.

Figure 7A:
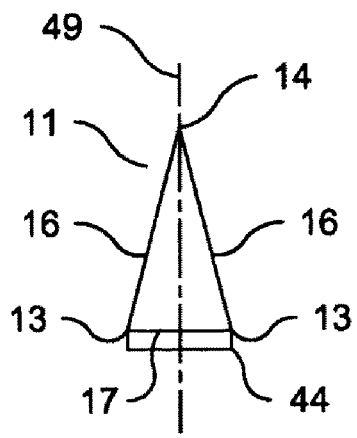
FIG. 7a is a cross-sectional view of a wedge illustrating linear side walls in accordance with an embodiment of the invention.
Figure 7B:
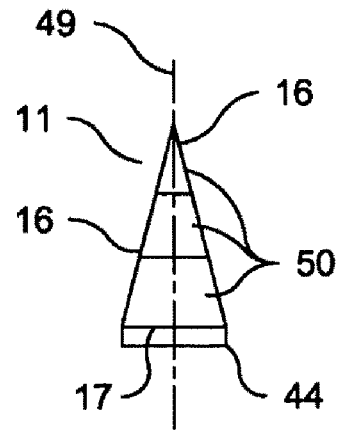
FIG. 7b is a cross-sectional view of a wedge illustrating a composite arrangement of layers through the thickness of the wedge in accordance with an embodiment of the invention.
Figure 8:
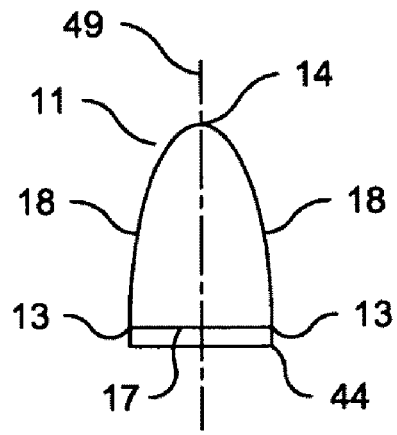
FIG. 8 is a cross-sectional view of a wedge illustrating convex-shaped side walls in accordance with an embodiment of the invention.
Figure 9:
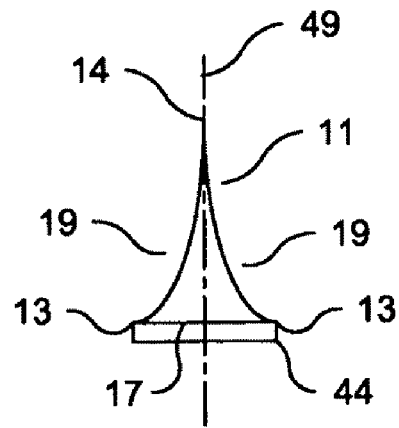
FIG. 9 is a cross-sectional view of a wedge illustrating concave-shaped side walls in accordance with an embodiment of the invention.

Referring now to FIGS. 7a-9, each wedge 11 includes a pair of side walls 16, 18, or 19 and a base wall 17 disposed in a generally triangular or polygonal arrangement. A base line 13 is formed at the intersection of each side wall 16, 18 or 19 with the base wall 17. A ridge line 14 is formed at the intersection of the side walls 16, 18, or 19 opposite of the base wall 17. In preferred embodiments, the side walls 16 and base wall 17 are planar shaped elements with a linear profile, as represented in FIG. 7a. In some embodiments, the wedge 11 could be comprised of a plurality of layers 50 which traverse the thickness thereof, as represented in FIG. 7b. In yet other embodiments, the side walls 18, 19 could include a convex or concave profile, as represented in FIGS. 8 and 9, respectively. In preferred embodiments, the side walls 16, 18, 19 are symmetrically arranged about the centerline 49 of the wedge 11. However, the side walls 16, 18, 19 could be asymmetrically disposed about the centerline 49 to facilitate contact along a contact plane 15 when the first angle 46 and second angle 47 are not equal. Furthermore, asymmetrical arrangements could include two different wall profiles. The height and width of the wedges 11 are design dependent.

Referring now to FIGS. 10 and 11, the otherwise linear wedges 11 in FIG. 2 are now shown having a generally non-linear or arcuate shape. In these embodiments, the side walls 16, 18, 19 are curved so as to intersect the base wall 17 forming arcuate-shaped base lines 13 and a ridge line 14 about the contact plane 15 in the plane of the backing wall 25. For illustrative purposes, only one pair of wedges 11 is shown, although it is understood that the absorber assembly 10 would include a plurality of other arcuate wedges 11 disposed in a generally parallel arrangement with the wedges 11 shown in FIGS. 10 and 11.

Referring now to FIG. 12, the otherwise linear wedges 11 in FIG. 2 are now shown having another generally non-linear or arcuate shape about the contact plane 15. In this embodiment, the base wall 17 is curved so as to intersect the side walls 16, 18, 19 forming an arcuate-shaped ridge line 14 and base lines 13 immediately adjacent to the backing wall 25.

Referring now to FIGS. 13 and 14, the absorber assembly 10 is shown including a composite arrangement of wedges 11 so that the angular orientation of wedges 11 varies along the length of the absorber assembly 10. In FIG. 13, the first and second groups 8, 9 are shown orientated at three wedge angles 12, 21, and 22 along the length of the absorber assembly 10 so that at least some wedges 11 contact in a pair-wise arrangement along the contact plane 15. In FIG. 14a, the first and second groups 8, 9 of the innermost wedges 11 are positioned at an angular arrangement along the length of the absorber assembly 10. The wedges 11 are disposed between a plurality of horizontal wedges 23 and a plurality of vertical wedges 24. The specific orientation of wedges 11, 23, 24 along the interior surface of a chamber wall is based on the performance specifications for the EMC, antenna, or RCS application. In some embodiments, the absorber assembly 10 could include a plurality of curved wedges 51, as represented in FIG. 14b.

Referring again to FIG. 13, the contact plane 15, along which the pair-wise arrangement of wedges 11 intersect, is preferred to be disposed in a horizontal arrangement along the length of the absorber assembly 10 and at a height along the centerline of the quiet zone 3, test item 4, and/or test chamber 1. However, the contact plane 15 could be disposed at a skew angle 45 so that the wedges 11 disposed in a pair-wise arrangement are also in a generally diagonal or skewed arrangement relative to the centerline 53 of the quiet zone 3, test item 4, and/or test chamber 1 to minimize diffraction. It is likewise possible for the inward and outward angular arrangements in FIGS. 4 and 5 to also be skewed along the skew angle 45. Furthermore, the contact plane 15 could be positioned at a height above or below the centerline of the quiet zone 3, test item 4, and/or test chamber 1.

The side walls 5, top wall 6, and bottom wall 7 described herein are used with flat and/or shaped walls along the front or back ends of a test chamber 1. While a variety of designs are possible, FIG. 20 shows an exemplary end wall 54 which is pyramidal shaped having a plurality of pyramid-shaped absorbers 55 thereon.

Functional aspects of the prior art and instant invention are now described with particular reference to FIGS. 15-17.

Referring now to FIG. 15, a plurality of pyramid-shaped absorbers 31 are shown contacting and attached to an absorber base 44 adjacent to a backing plate 30. The absorber base 44 is an integral part of the pyramid-shaped absorbers 31 and is composed of an absorptive material. The backing plate 30 could be a metallic plate or the wall of a test chamber 1.

The pyramid-shaped absorbers 31 generate multiple reflections after an incident field 33 impinges the system at an incidence angle 32 (θ) with respect to the horizontal. Dominant reflections include a reflected wave 34 from the front surface of the pyramid-shaped absorbers 31 and a reflected wave 35 from the surface of the backing plate 30.

As the incidence angle 32 approaches 90° with respect to the face of the pyramid-shaped absorbers 31, the reflected waves 34, 35 may cancel each other at a number of frequencies, thus significantly improving the reflectivity of the system. The region near the lowest frequency where reflections cancel is the lowest operating frequency 38 of the system, as illustrated in the reflectivity versus frequency plot in FIG. 18. The absorption performance at intermediate frequencies is determined by the absorption and scattering properties of the system, and is characterized by multiple reflectivity nulls 39 at frequencies where the two reflections cancel, as further illustrated in FIG. 18. Finally, the absorption performance at a higher frequency end is determined by the absorption properties of the material and scattering associated with reflections from the front surface of the pyramid-shaped absorbers 31 only.

At off-normal incidence, the reflectivity of absorbing materials decreases, in part due to the fact that the two dominant reflections are not canceled. In addition, the scattering from the front surface of the pyramid-shaped absorber 31 is not planar, but rather three-dimensional being better described by Geometrical Theory of Diffraction rather than Geometrical Optics, as illustrated by the scatter region 36 in FIG. 15, which radiates in many directions including paths intersecting the quiet zone 3 during EMC and antenna measurements and the source 2 after back reflection from a device under test and the chamber walls in RCS applications, regardless of the shape of the backing plate 30.

Referring now to FIGS. 16 and 17, a plurality of parallel or smoothly changing wedges 11 are now arranged in the v-shaped repeating pattern as described herein and attached to an absorber base 44 adjacent to a backing plate 30. At normal incidence, the system functions as described above. However, the absorber assembly 10 offers improved performance over the system described in FIG. 15 at angles less than normal by reducing the undesired effect of the scatter region 36 so as to improve control over the diffracted field. This control may be utilized to improve reflectivity performance in the various applications described herein.

Referring again to FIGS. 16 and 17, the incident field 33 impinges the wedges 11 producing a cone-shaped diffractive wave 37 at an angle (τ) from a tangent vector 40 to the ridge line 14 of a wedge 11 equal to the incidence angle 32. If the orientation of the wedges 11 is changed with respect to the incident field 33, then the diffractive wave 37 does so also, thus facilitating control of the diffractive wave 37 away from the quiet zone 3 in EMC and antenna measurements and quiet zone 3 and a source during RCS measurements. The formation of diffractive waves 37 and control thereof is applicable to straight wedges 11 and others described herein.

The absorber assembly 10 minimizes scattering within an anechoic chamber via the control of reflections and diffractions. During a first impingement of an incident field 33 with an absorber assembly, the electromagnetic wave is partially reflected away from the quiet zone, test item, and/or source by the absorber assembly 10. When used in conjunction with wall shaping, it is possible to further reflect energy away from the quiet zone. The intersecting and angular arrangement of wedges 11 also allows control of the diffracted electromagnetic wave within the primary scattered field away from the quiet zone, test item, and/or source. Any subsequent or secondary impingement of the diffracted wave with an absorber assembly 10 produces a secondary scattered field, of much lower magnitude than the primary field, which further, via a plurality of solutions, may likewise be directed in a controlled fashion away from the quiet zone, test item, and/or source.

Referring now to FIGS. 19a and 19b, two exemplary plots compare the predicted reflectivity performance of a test chamber 1 with a conventional arrangement of pyramid-shaped absorbers 31 and intersecting wedges 11 described herein, respectively. Predicted performance is for illustrative purposes only and not intended to restrict or limit the scope of the claimed invention. Predictions were performed using the software package CST Studio Suite sold by CST of America, Inc. located in Framingham, Mass.

The pyramid-shaped absorbers 31 applied to the side walls 5, top wall 6, and bottom wall 7 of the test chamber 1 yielded a large number of reflections across and adjacent to the quiet zone 3 with a calculated reflectivity of −28 dB, as illustrated in FIG. 19a. In comparison, intersecting wedges 11 applied to a shaped wall yielded fewer reflections across and adjacent to the quiet zone 3 with a more uniform field across the test item 4 and a calculated reflectivity of −36 dB, as illustrated in FIG. 19b.

As is evident from the explanation herein, the described invention includes an arrangement of v-shaped absorbers, applicable to walls with and without shaping, which improve control over reflectivity within a chamber so as to better control primary and secondary scattering effects, thus minimizing reflections within a quiet zone and reducing quiet zone clutter. Accordingly, the described invention is expected to be applicable to a variety of test chambers which collect data for electromagnetic compatibility, far-field antenna patterns, near-field measurements, radar cross section, or other such similar applications.

The description above indicates that a great degree of flexibility is offered in terms of the invention. Although various embodiments have been described in considerable detail with reference to certain preferred versions thereof, other versions are possible. Therefore, the spirit and scope of the appended claims should not be limited to the description of the preferred versions contained herein.

What is claimed is:

1. An absorber assembly for use within an anechoic chamber comprising:
    (a) a plurality of first wedges which are substantially parallel; and
    (b) a plurality of second wedges which are substantially parallel;
    wherein said first wedges and said second wedges are disposed so as to form an intersecting pattern which is substantially v-shaped, each of said first wedges and said second wedges having a substantially triangular-shaped cross section with a pair of side walls and a base wall bound between a first end and a second end, said second end of each said first wedges contacts and covers one said first end of each said second wedges along a contact plane, said first wedges and said second wedges disposed at an angle about said contact plane, said absorber assembly accounting for specular reflections and diffracted waves so as to better control primary and secondary scattered fields within said anechoic chamber.

2. The absorber assembly of claim 1, wherein said first wedges and said second wedges are disposed in a convex and/or concave arrangement about said contact plane along a wall.

3. The absorber assembly of claim 1, wherein at least one of said side walls is linear shaped or non-linear shaped.

4. The absorber assembly of claim 1, wherein said first wedges and said second wedges are disposed in an asymmetrical arrangement about said contact plane.

5. The absorber assembly of claim 1, wherein said contact plane is biased to one side of said absorber assembly.

6. The absorber assembly of claim 1, wherein said first wedges and said second wedges are arcuate shaped along the length of said wedges.

7. The absorber assembly of claim 1, wherein said angle varies along the length of said absorber assembly.

8. The absorber assembly of claim 1, wherein said contact plane is skewed.

9. The absorber assembly of claim 1, wherein said anechoic chamber collects data for electromagnetic compatibility, far-field antenna pattern, near-field measurements, or radar cross section.

10. The absorber assembly of claim 1, wherein said anechoic chamber is a tapered or compact range design or illuminated by a direct source antenna.

11. The absorber assembly of claim 1, wherein said plurality of first wedges and said plurality of second wedges are applied to partially cover at least one interior surface of said anechoic chamber.

12. The absorber assembly of claim 1, wherein said anechoic chamber includes at least one end wall which is shaped and includes a plurality of pyramid-shaped or wedge-shaped absorbers.

13. The absorber assembly of claim 12, wherein said anechoic chamber collects data for electromagnetic compatibility, far-field antenna pattern, near-field measurements, or radar cross section.

14. The absorber assembly of claim 12, wherein said anechoic chamber is a tapered or compact range design or illuminated by a direct source antenna.

15. The absorber assembly of claim 1, wherein at least one wall of said anechoic chamber is shaped and said plurality of first wedges and said plurality of second wedges at least partially cover said wall.

16. The absorber assembly of claim 15, wherein said anechoic chamber collects data for electromagnetic compatibility, far-field antenna pattern, near-field measurements, or radar cross section.

17. The absorber assembly of claim 15, wherein said anechoic chamber is a tapered or compact range design or illuminated by a direct source antenna.

18. A method for minimizing scattering within an anechoic chamber comprising the steps of:
(a) reflecting an electromagnetic wave away from a quiet zone, a test item, and/or a source after a first impingement with an absorber assembly;
(b) controlling the diffraction of said electromagnetic wave away from said quiet zone, said test item, and/or said source after said first impingement; and
(c) controlling the diffraction of said electromagnetic wave away from said quiet zone, said test item, and/or said source after a second impingement by said electromagnetic wave in step (b);
wherein said absorber assembly includes:
(i) a plurality of first wedges which are substantially parallel; and
(ii) a plurality of second wedges which are substantially parallel;
wherein said first wedges and said second wedges are disposed so as to form a pattern which is substantially v-shaped, each of said first wedges and said second wedges having a substantially triangular-shaped cross section with a pair of side walls and a base wall bound between a first end and a second end, said second end of each said first wedges contacts and covers one said first end of each said second wedges along a contact plane, said side walls intersecting to form a ridge line, said ridge line being substantially v-shaped along a pair of contacting said first wedge and said second wedge, said ridge line controls the diffraction of said electromagnetic wave after said first impingement and said second impingement.

19. The absorber assembly of claim 18, wherein said anechoic chamber collects data for electromagnetic compatibility, far-field antenna pattern, near-field measurements, or radar cross section.

20. The absorber assembly of claim 18, wherein said anechoic chamber is a tapered or compact range design or illuminated by a direct source antenna.

* * * * *